(12) United States Patent
Huang

(10) Patent No.: US 9,984,986 B1
(45) Date of Patent: May 29, 2018

(54) SEMICONDUCTOR DEVICE AND METHOD OF MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days. days.

(21) Appl. No.: 15/432,814

(22) Filed: Feb. 14, 2017

(51) Int. Cl.
*H01L 25/03* (2006.01)
*H01L 23/00* (2006.01)

(52) U.S. Cl.
CPC ............. *H01L 24/03* (2013.01); *H01L 24/06* (2013.01); *H01L 24/13* (2013.01); *H01L 2224/0225* (2013.01); *H01L 2224/02255* (2013.01); *H01L 2224/03011* (2013.01); *H01L 2224/03614* (2013.01); *H01L 2224/0401* (2013.01); *H01L 2224/06188* (2013.01); *H01L 2224/13026* (2013.01)

(58) Field of Classification Search
CPC ........................................................ H01L 24/03
See application file for complete search history.

(56) References Cited

U.S. PATENT DOCUMENTS

| 6,759,319 | B2 | 7/2004 | Viswanadam et al. |
| 2011/0241202 | A1 | 10/2011 | Liu et al. |
| 2014/0091473 | A1* | 4/2014 | Len .......................... H01L 24/05 257/774 |

* cited by examiner

*Primary Examiner* — William Harriston
(74) *Attorney, Agent, or Firm* — Foley & Lardner LLP; Cliff Z. Liu

(57) ABSTRACT

A semiconductor device includes a substrate, a patterned conductive layer on the substrate, a passivation layer on the substrate and surrounding the patterned conductive layer, a first under bump metallurgy (UBM) and a second UBM on the passivation layer and electrically connected to the patterned conductive layer, and an isolation structure on the passivation layer and between the first UBM and the second UBM.

28 Claims, 21 Drawing Sheets

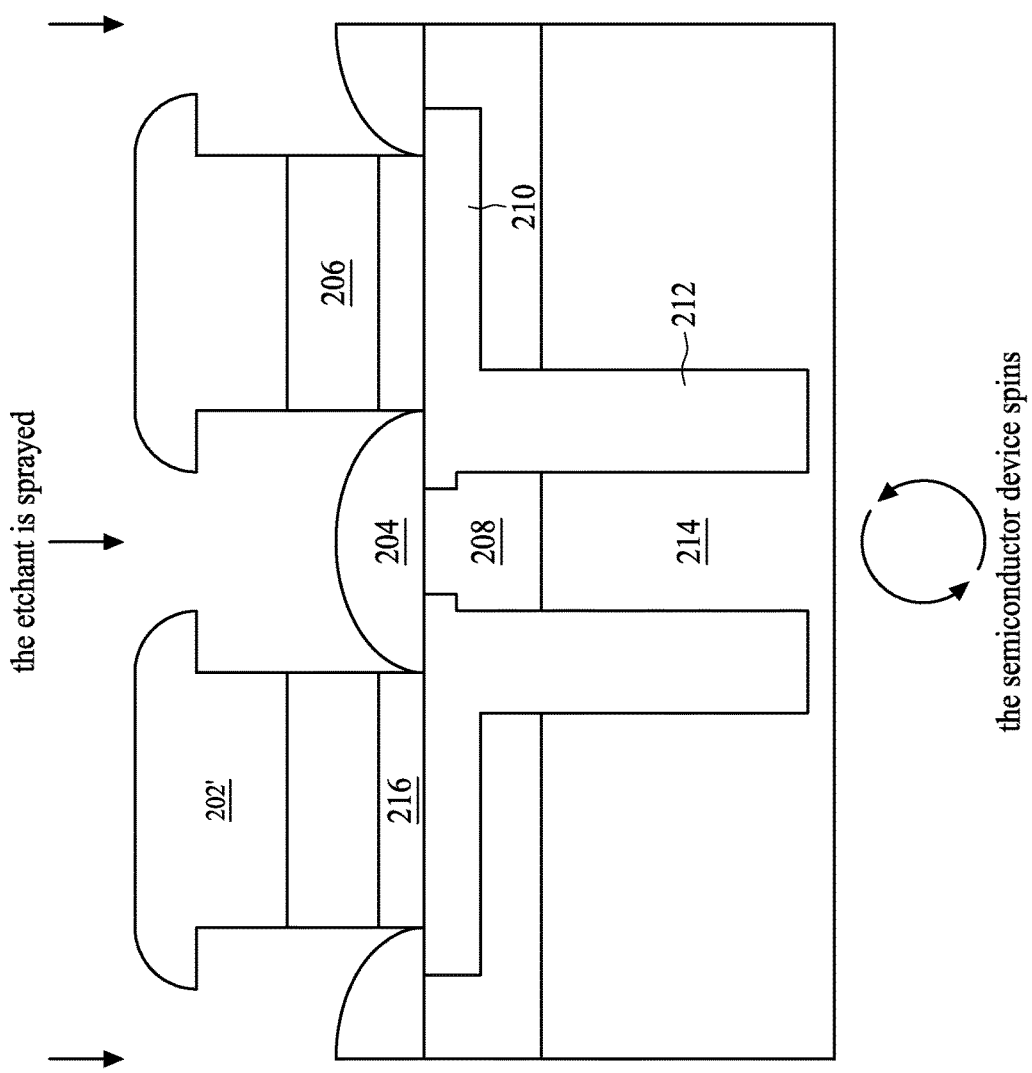

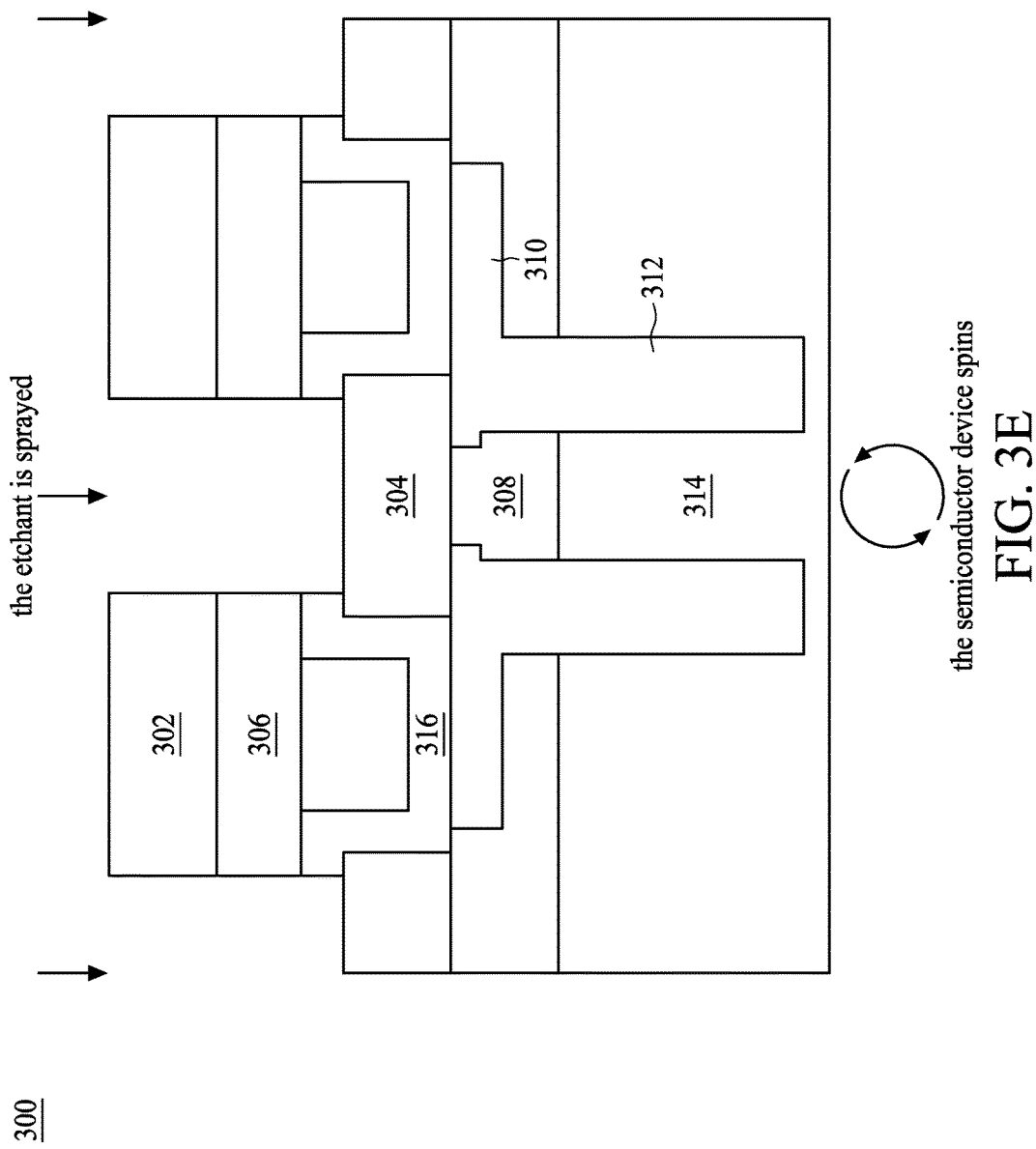

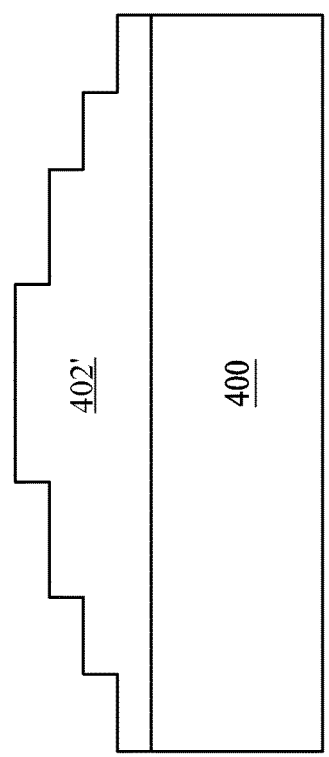
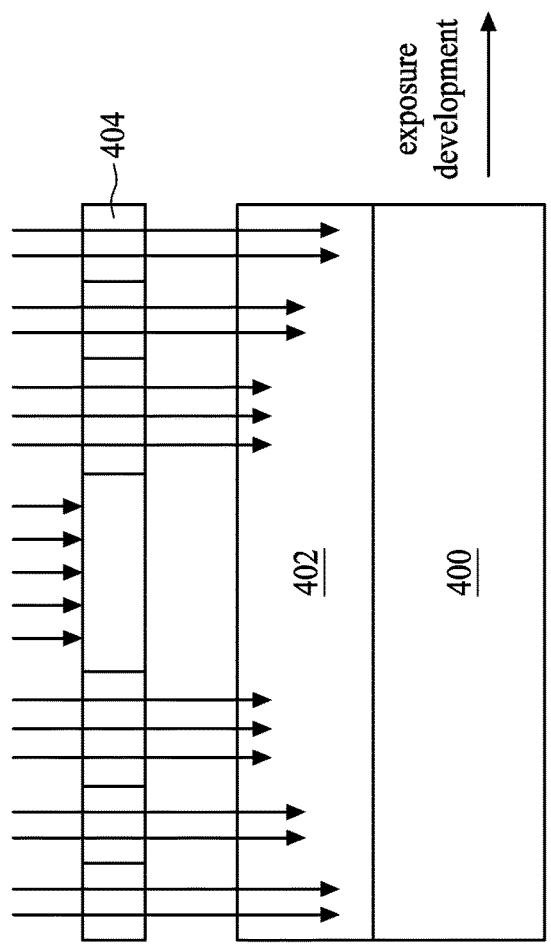
FIG. 4B
FIG. 4A

SEMICONDUCTOR DEVICE AND METHOD OF MANUFACTURING THE SAME

BACKGROUND

1. Technical Field

The present disclosure relates to a semiconductor device and a method of manufacturing the same, and more particularly to a semiconductor device including isolation structures between under bump metallurgies (UBMs) and a method of manufacturing the same.

2. Description of the Related Art

Due to an increase in the number of inputs/outputs (I/O) of semiconductor packages, a pitch between solder bumps (including the corresponding UBMs thereunder) is reduced in the package. Accordingly, forming solder bumps and the corresponding UBMs thereunder (e.g., conductive pillars formed by a stack of layers) in a packaging process using conventional techniques provides challenges. A seed layer is formed for subsequent formation of the conductive pillars and solder bumps. After the formation of the solder bumps, portions of the seed layer which are not covered by the UBMs should be removed (e.g. by a wet-etching technique) to avoid a short circuit between the solder bumps. However, in the regions where condensed solder bumps are to be formed, it would be difficult to apply an etchant for removing the seed layer into the space between the solder bumps due to the relative high density (e.g., the pitches of the bumps may be less than 40 micrometers (μm)). An over-etching technique, which increases time and cost of the etching operation, may be used to facilitate removal of portions of the seed layer between the solder bumps, however, the UBMs under the solder bumps may be damaged. For example, a solder bump, which may have a width of 15 μm should correspond to a UBM having a width of about 15 μm. After the over-etching process, the conductive pillar may merely have a width of 9 μm remaining (e.g., each of two sides of the conductive pillar may lose 3 μm), and therefore the UBM may be vulnerable to cracking.

SUMMARY

In accordance with some embodiments of the present disclosure, a semiconductor device includes: a substrate; a patterned conductive layer on the substrate; a passivation layer on the substrate; a first under bump metallurgy (UBM) and a second UBM on the passivation layer; and an isolation structure on the passivation layer and between the first UBM and the second UBM. The passivation layer surrounds the patterned conductive layer. The first and second UBMs are electrically connected to the patterned conductive layer.

In accordance with some embodiments of the present disclosure, a semiconductor device includes: a substrate; a patterned conductive layer on the substrate; a passivation layer on the substrate; a first seed layer and a second seed layer on the passivation layer; and an isolation structure between and contacting the first seed layer and the second seed layer. The passivation layer surrounds the patterned conductive layer and exposes a first portion and a second portion of the patterned conductive layer. The first portion of the patterned conductive layer may be separated from the second portion of the patterned conductive layer. The first seed layer is in contact with the first portion of the patterned conductive layer, and the second seed layer is in contact with the second portion of the patterned conductive layer.

In accordance with some embodiments of the present disclosure, a method for manufacturing a semiconductor device includes: providing a substrate; forming a patterned conductive layer on the substrate; forming a first patterned passivation layer on the substrate to surround the patterned conductive layer and to expose portions of the patterned conductive layer; and forming a second patterned passivation layer on the first patterned passivation layer and parts of the exposed portions of the patterned conductive layer.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 2G and FIG. 2H illustrate a method of manufacturing a semiconductor device in accordance with some embodiments of the present disclosure.

FIG. 3A, FIG. 3B, FIG. 3C, FIG. 3D, FIG. 3E, and FIG. 3F illustrate a method of manufacturing a semiconductor device in accordance with some embodiments of the present disclosure;

FIG. 4A and FIG. 4B illustrate a method of manufacturing an isolation structure using a grayscale photomask in accordance with some embodiments of the present disclosure;

DETAILED DESCRIPTION

Figure 1A:
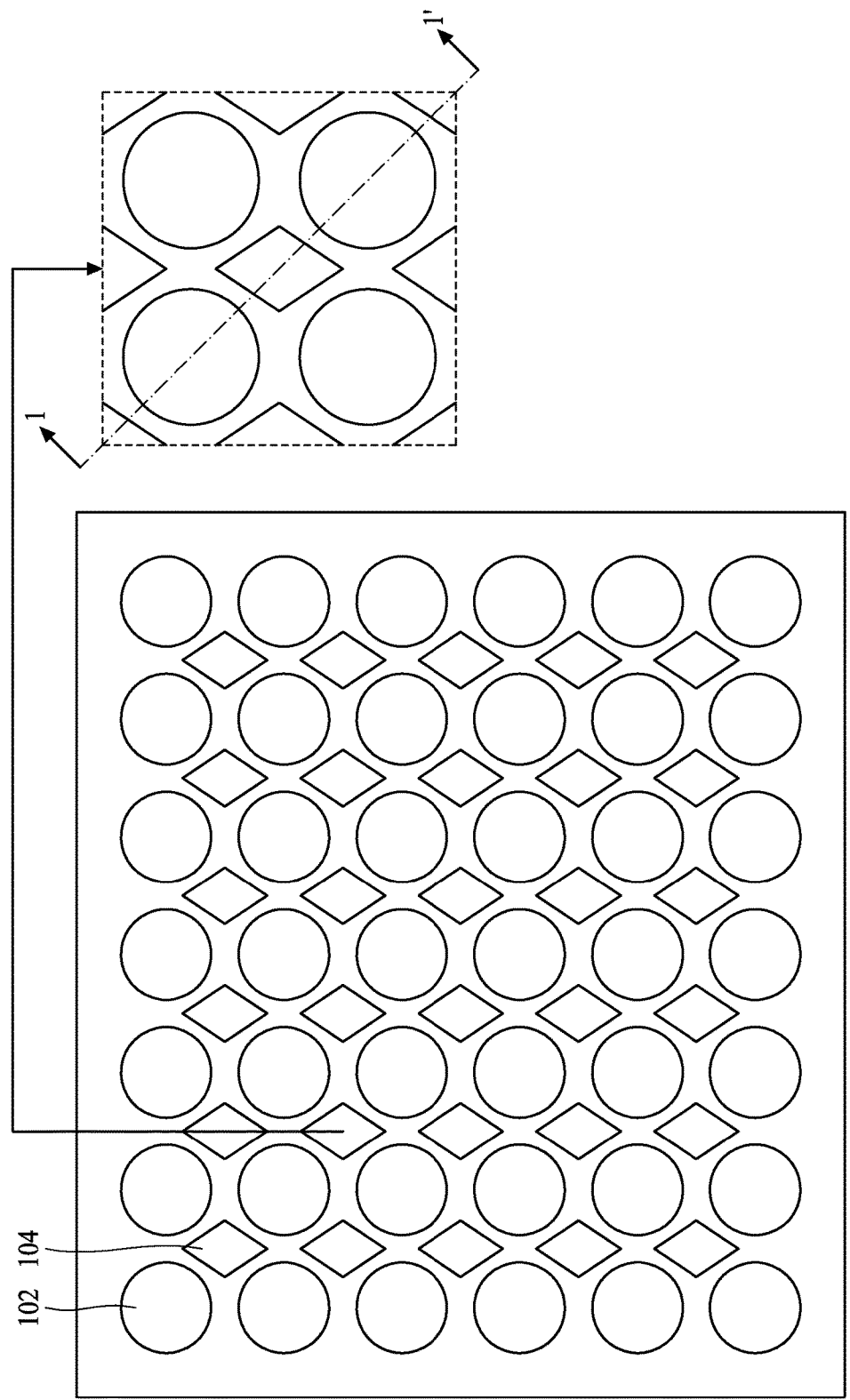
FIG. 1A is a top view of a semiconductor device in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a top view of a semiconductor device 100 in accordance with some embodiments of the present disclosure. Solder bumps 102 (or solder balls) and isolation structures 104 are arranged as shown in FIG. 1A. The solder bumps 102 may be formed with a conductive material. The solder bumps 102 may be formed with a metal, an alloy or the like. The solder bumps 102 may include tin (Sn). The isolation structure 104 may include an insulating material. An enlarged view of semiconductor device 100 is also illustrated in the upper-right section of FIG. 1A.

Figure 1B:
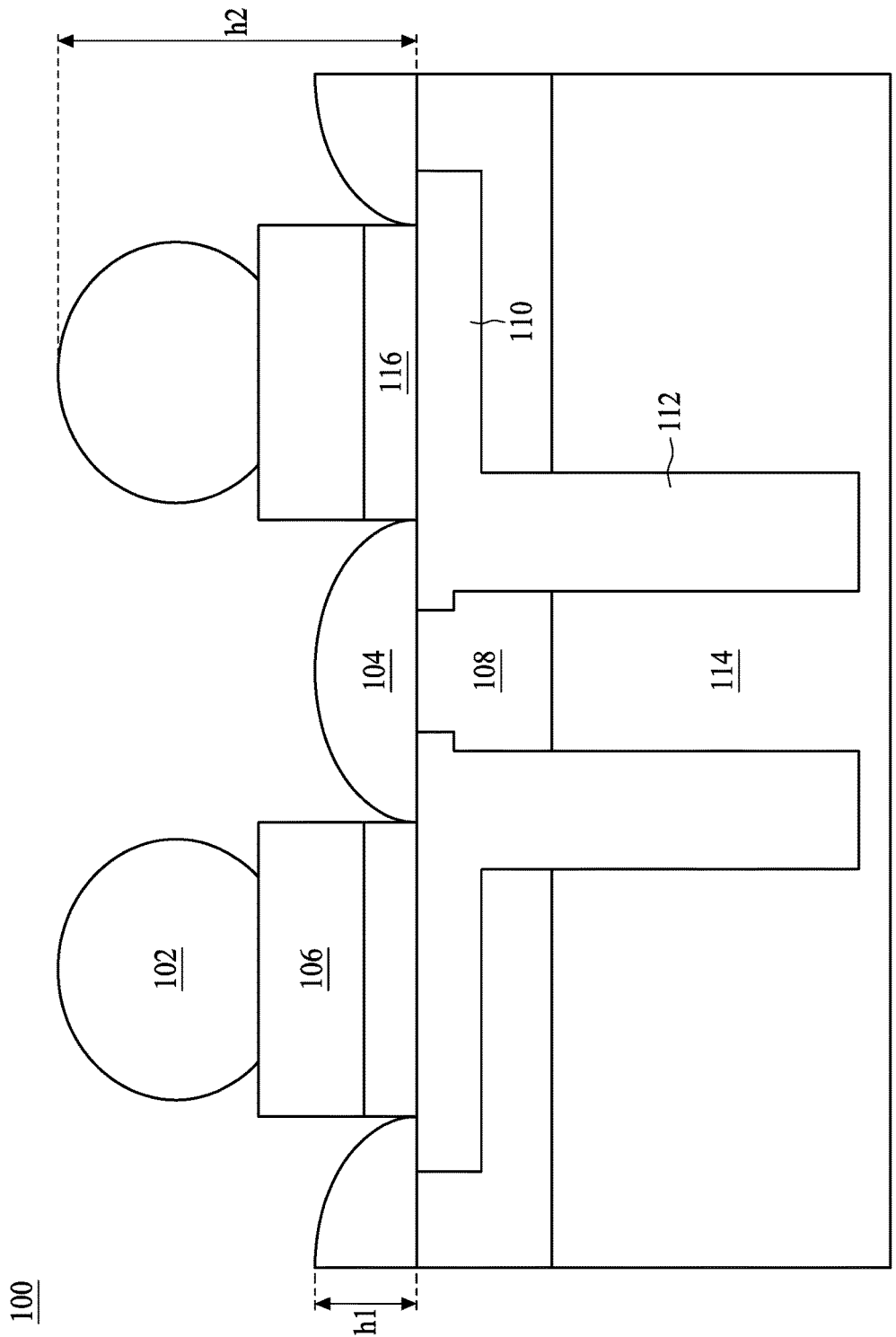
FIG. 1B is a cross-sectional view of a semiconductor device in accordance with some embodiments of the present disclosure.

FIG. 1B is a cross-sectional view across line 1-1' as shown in FIG. 1A in accordance with some embodiments of the present disclosure. Referring to FIG. 1B, the semiconductor device 100 includes the solder bumps 102, the isolation structures 104, under bump metallurgies (UBMs) 106, a passivation layer 108, a patterned conductive layer 110, conductive vias 112, a substrate 114, and a seed layer 116.

The isolation structures 104 protrude from a top surface of the passivation layer 108. Each of the isolation structures 104 may have, for example, but are not limited to, a semi-elliptical cross section. The isolation structures 104 contact the seed layer 116. One or more of the isolation structures 104 may contact the seed layer 116 under the UBMs 106. A height of one of the isolation structures is h1. One of the UBMs 106, the solder bump 102 on the UBM 106, and the seed layer 116 under the UBM 106 have a height of h2. A ratio of the height h1 to the height h2 ranges from approximately 0.05 to approximately 0.4. A ratio of the height h1 to the height h2 ranges from approximately 0.1 to approximately 0.2. The conductive vias 112, which are made of a conductive material, are formed in the substrate 114. The passivation layer 108 on the substrate 114 may include an insulating material. The passivation layer 108 surrounds the patterned conductive layer 110. The patterned conductive layer 110 may include a conductive material. The patterned conductive layer 110 is electrically connected to the conductive vias 112. The substrate 114 may include an organic substrate, a ceramic substrate, a glass substrate, or another suitable substrate type.

The UBM 106 is electrically connected to the patterned conductive layer 110. The UBM 106 may include a conductive pillar which includes, for example, but is not limited to, a stack of conductive layers. In some embodiments of the present disclosure, the UBM 106 may include a conductive pillar which includes a single conductive layer. The UBM 106 may include an adhesion-promoting layer, a diffusion barrier layer, and a solderable layer. The adhesion layer may include aluminum or another metal composition that will bond to an underlying input/output pad (e.g., an aluminum pad). The solderable layer (e.g., top layer) may include copper, which is readily solderable (e.g., copper can be wetted by and metallurgically bonded to solder alloys of the type used for solder bumps). The diffusion barrier layer may include a nickel-vanadium (NiV) or chromium-copper (CrCu) alloy, and is disposed between the adhesion and solderable layers to inhibit diffusion between the solder and aluminum pads. A NiV and CrCu layer also serves as a wettable layer if an overlaying copper layer is dissolved into the solder alloy. The seed layer 116 is between the UBM 106 and the patterned conductive layer 110. For example, the UBM 106 is formed on the seed layer 116. Additionally, bonding terminals or pads of an active component (e.g. a semiconductor chip or die) may be bonded to the UBM 106 via the solder bump 102.

Figure 1C:
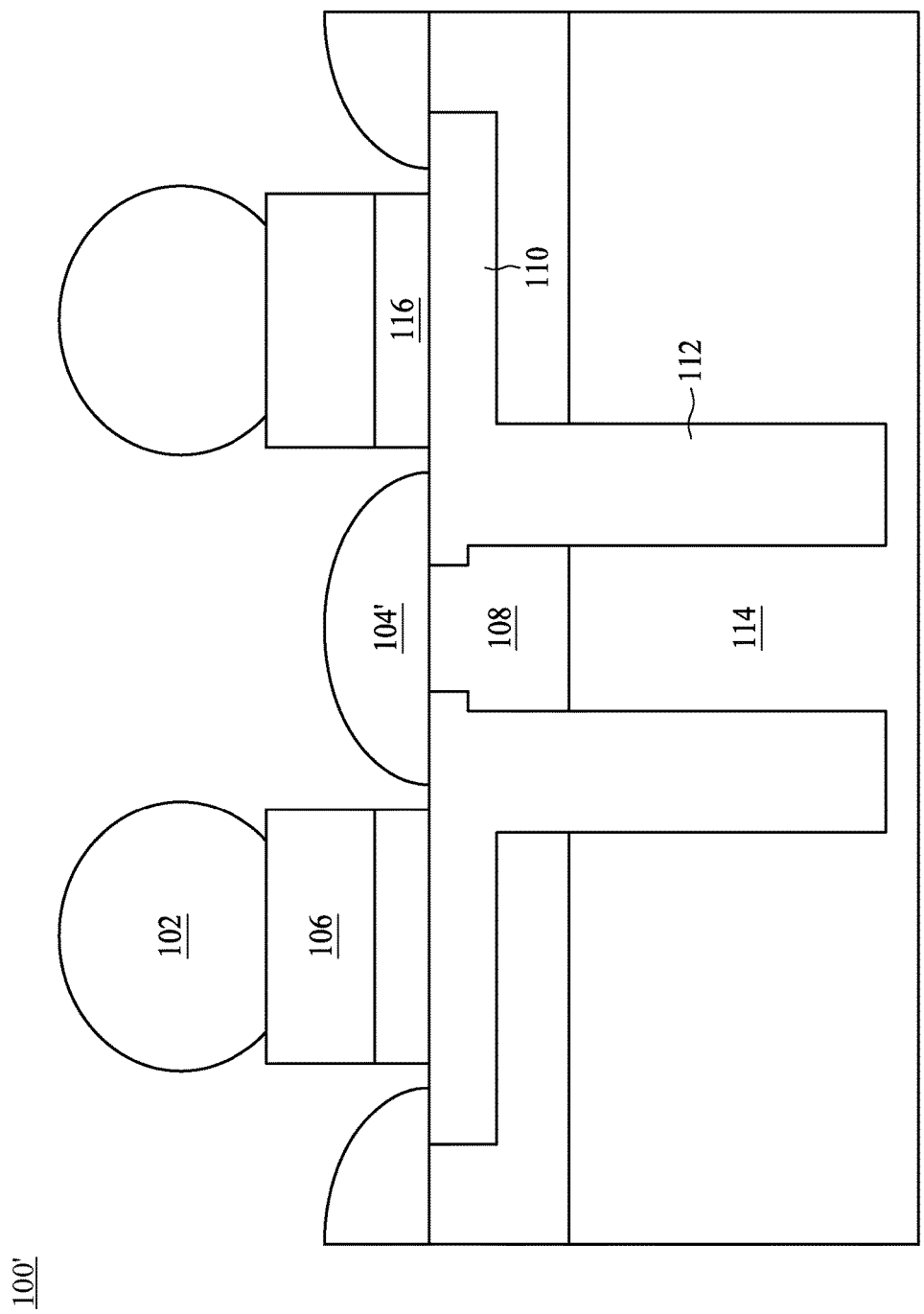
FIG. 1C is a cross-sectional view of a semiconductor device in accordance with some embodiments of the present disclosure.

FIG. 1C is a cross-sectional view of a semiconductor device in accordance with some embodiments of the present disclosure. Referring to FIG. 1C, a semiconductor device 100' is similar to the semiconductor device 100 as illustrated and described with reference to FIG. 1B, except that the isolation structure 104' as shown in FIG. 1C do not contact the seed layer 116 under the UBMs 106. The isolation structure 104' is spaced or separated from the seed layer 116.

Referring to FIGS. 1B and 1C, the distance between an isolation structure 104 (or 104') and an adjacent UBM 106 is smaller than the distance between any two UBMs 106.

FIGS. 2A, 2B, 2C, 2D, 2E and 2F illustrate a method of manufacturing a semiconductor device in accordance with some embodiments of the present disclosure. The elements shown in FIGS. 2A-2F are similar to those with similar names shown in and described with respect to FIGS. 1A-1C.

Figure 2A:
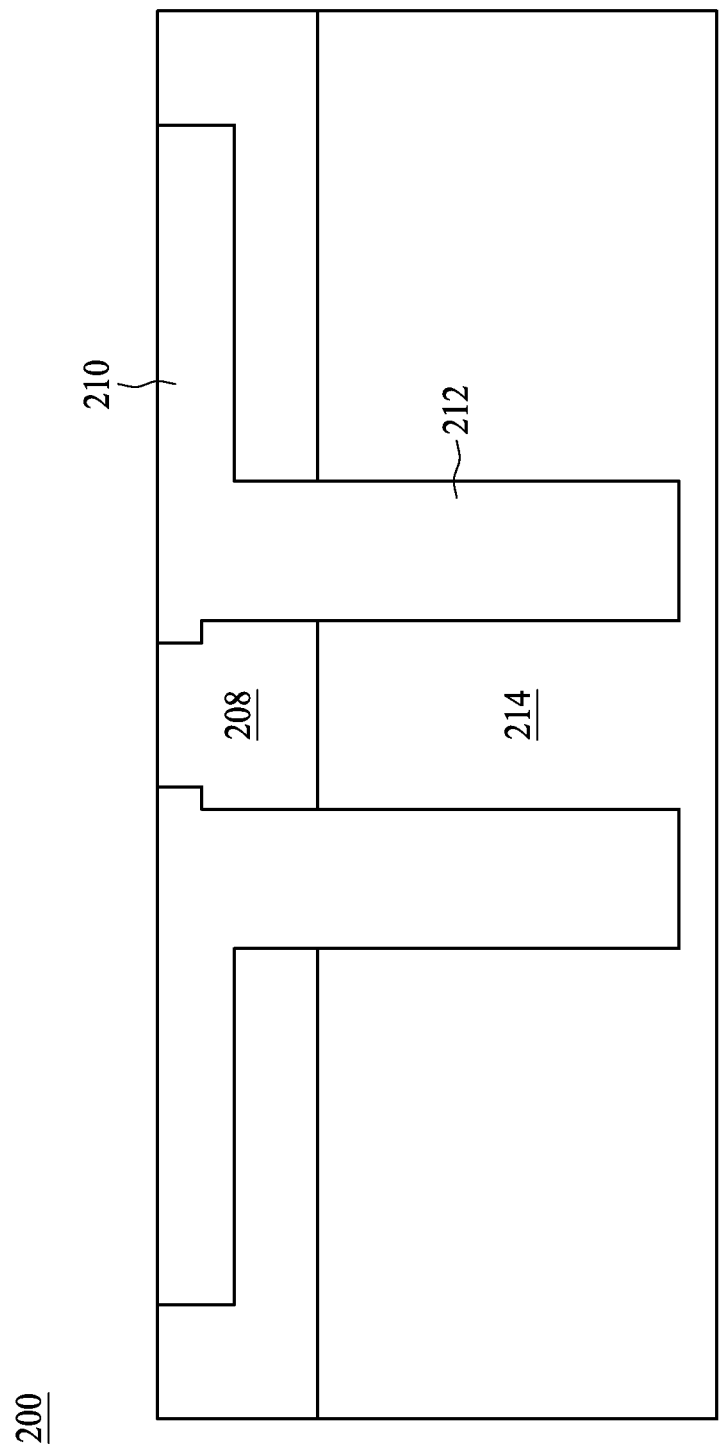
FIG. 2A, FIG. 2B, FIG. 2C, FIG. 2D, FIG. 2E and FIG. 2F illustrate a method of manufacturing a semiconductor device in accordance with some embodiments of the present disclosure.

Referring to FIG. 2A, the conductive vias 212, which are made of a conductive material, are formed in the substrate 214. The passivation layer 208, which is formed on the substrate 214, may include an insulating material. The passivation layer 208 surrounds the patterned conductive layer 210. A portion of the patterned conductive layer 210 is exposed by the top surface of the passivation layer 208. The patterned conductive layer 210 may include a redistribution layer (RDL) which may include traces and/or interconnections (e.g., vias). The patterned conductive layer 210 may include a conductive material. The patterned conductive layer 210 is electrically connected to the conductive vias 212. The substrate 214 may include an organic substrate, a ceramic substrate, a glass substrate, or any other suitable substrate type. The patterned conductive layer 210 and conductive vias 212 may be formed by techniques such as photomasking, etching, depositing, electroplating, and the like.

Figure 2B:
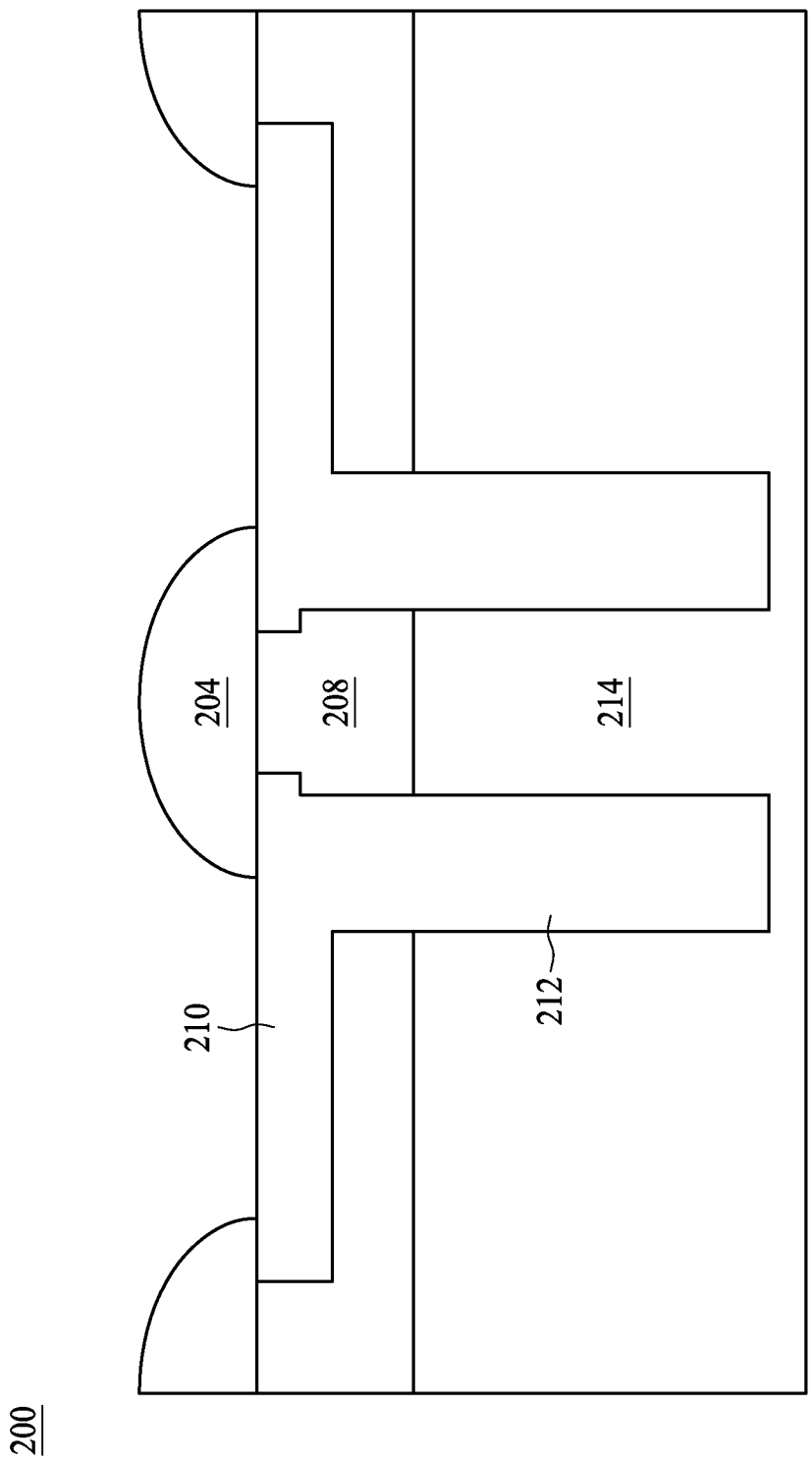

Referring to FIG. 2B, the isolation structures 204 are formed on the passivation layer 208 to cover parts of the passivation layer 208 and parts of exposed portions of conductive layer 210. The isolation structures 204 may include an insulating material. The isolation structures 204 may be formed by positive photoresists and grayscale photomasks (e.g., a photoresist 402 and grayscale photomask 404 as illustrated and described with reference to FIGS. 4A and 4B below).

Figure 2C:
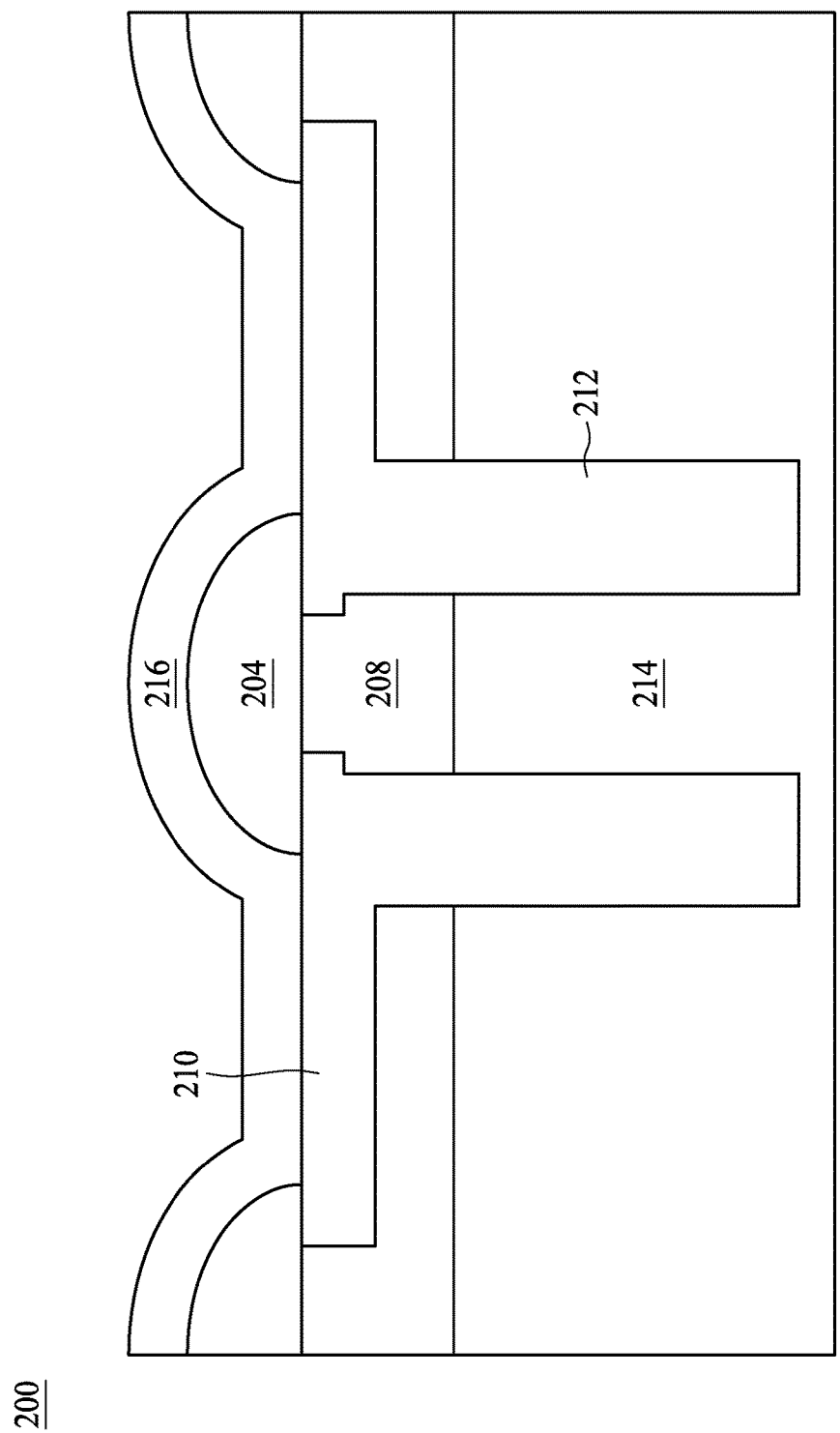

Referring to FIG. 2C, a seed layer 216 is formed (e.g., by a sputtering technique) onto the isolation structures 204, the passivation layer 208, and the patterned conductive layer 210 exposed by the isolation structures 204. The seed layer 216 may include, for example, but not be limited to, a titanium (Ti), copper (Cu), or combination thereof, layer. In some embodiments, the seed layer 216 may include two sublayers, in which a lower sublayer includes Ti and an upper sublayer includes Cu.

Figure 2D:
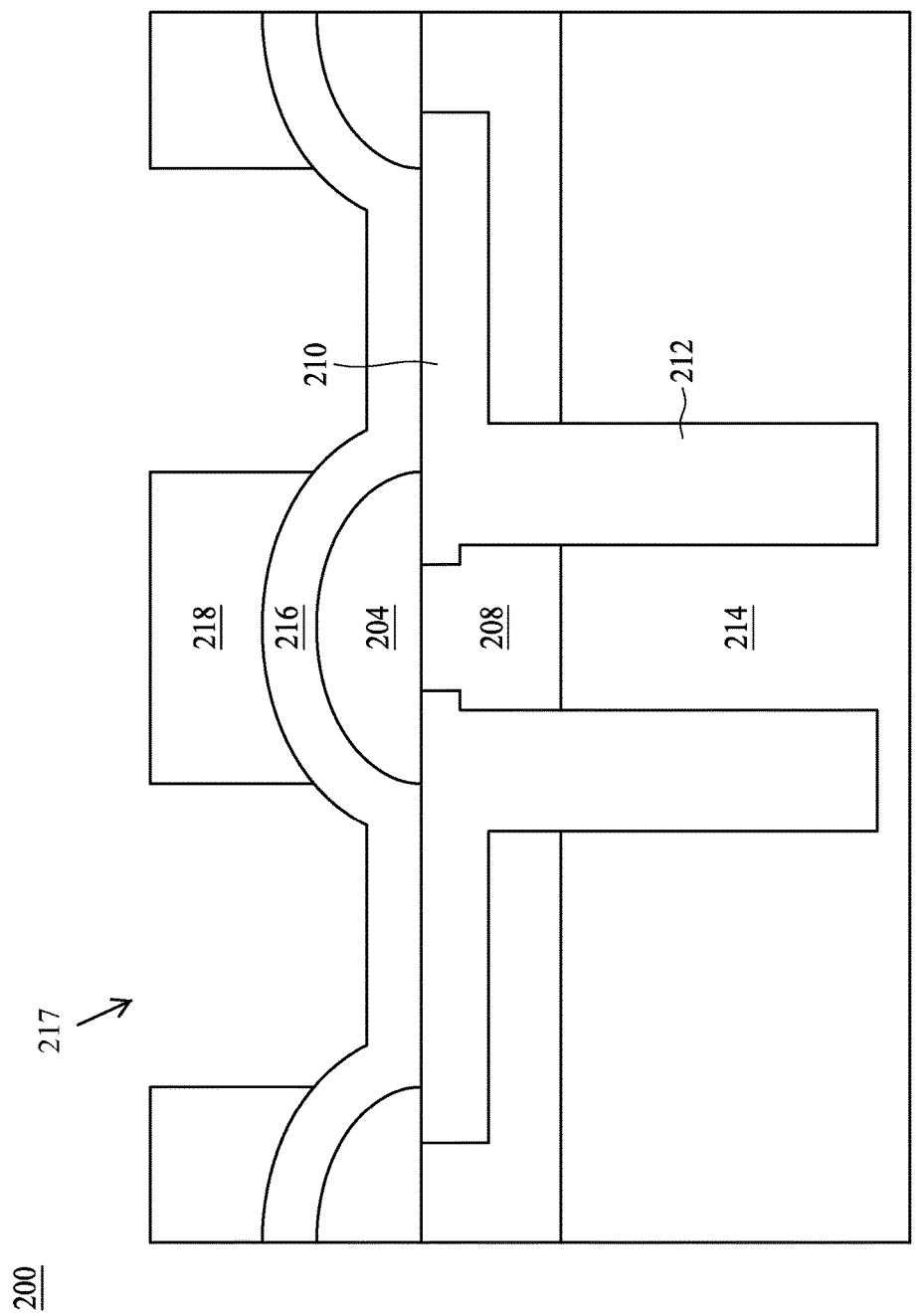

Referring to FIG. 2D, a patterned photoresist 218 is formed on the seed layer 216. The patterned photoresist 218 defines a plurality of openings 217. The patterned photoresist 218 may be formed by photolithographic techniques. For example, the patterned photoresist 218 may be formed using the process of photomask application, exposure, and development.

Figure 2E:
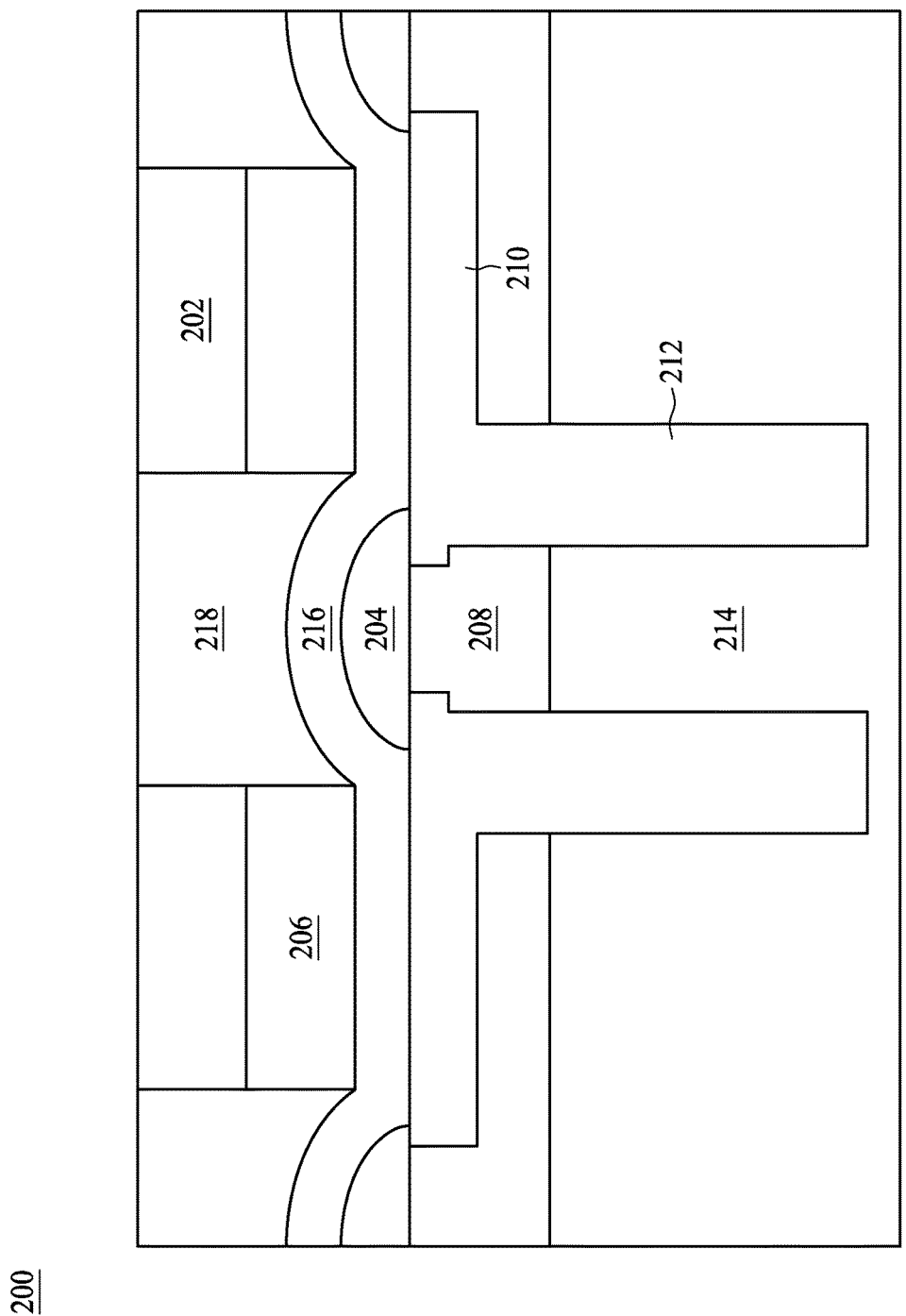

Referring to FIG. 2E, the UBMs 206 and solder paste 202 are formed on the seed layer 216. The UBMs 206 and the solder paste 202 are formed in the openings 217. The UBMs 206 and solder paste 202 may be formed by electroplating. The UBMs 206, solder paste 202, and patterned conductive layer 210 are electrically connected. The solder paste 202 may be formed with a conductive material. The solder paste 202 may be formed with a metal, an alloy or the like. The solder paste 202 may include Sn. The UBMs 206 may include a conductive pillar which includes, for example, but is not limited to, a stack of conductive layers. In some embodiments of the present disclosure, the UBMs 206 may include a conductive pillar which includes a single conductive layer. The UBMs 206 may include a metal composition including Ni and/or Cu.

Figure 2F:
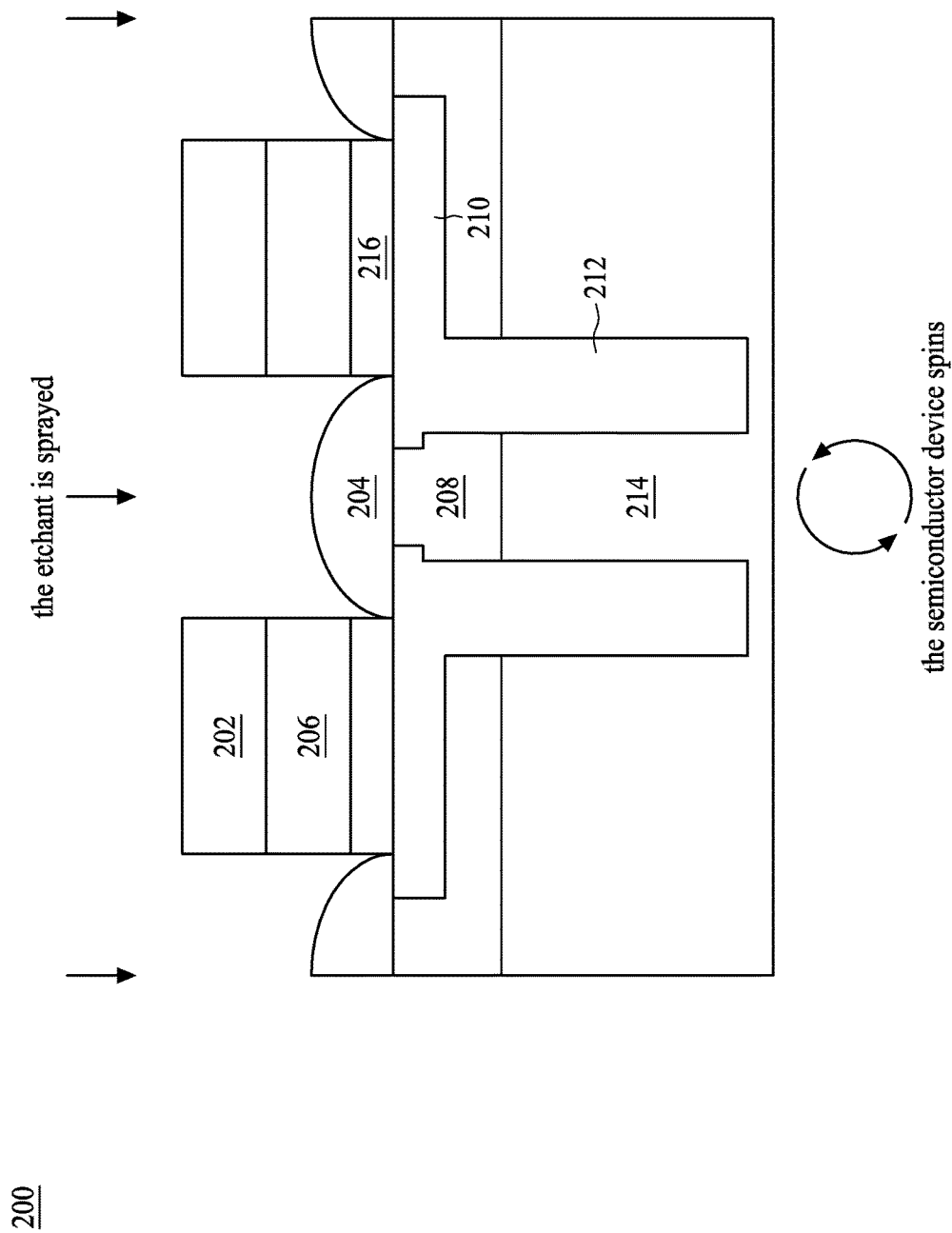

Referring to FIG. 2F, the patterned photoresist 218 and the seed layer 216 under the patterned photoresist 218 are removed by an etching technique (e.g., by spraying an etchant onto the structure as shown in FIG. 2F). During the spraying of the etchant, the structure as shown in FIG. 2E spins to facilitate the etching. The space or gap between the isolation structure 204 and an adjacent UBM 206 (or an adjacent portion of the seed layer 216) creates capillarity or siphonage to help the etchant flow deep into the space or gap and to more efficiently remove the seed layer 216 under the patterned photoresist 218. Furthermore, the aspect ratio of the space between any two UBMs 206 is substantially reduced due to the isolation structures 204, and the reduced aspect ratio helps the etchant flow into spaces so as to more efficiently remove the portions of the seed layer 216 under the patterned photoresist 218.

The structure as shown in FIG. 2F may be reflowed to form the semiconductor device 100 as shown in FIG. 1B (e.g., an etchant may be sprayed on the solder paste 202 to form the solder bumps 102).

Figure 2G:
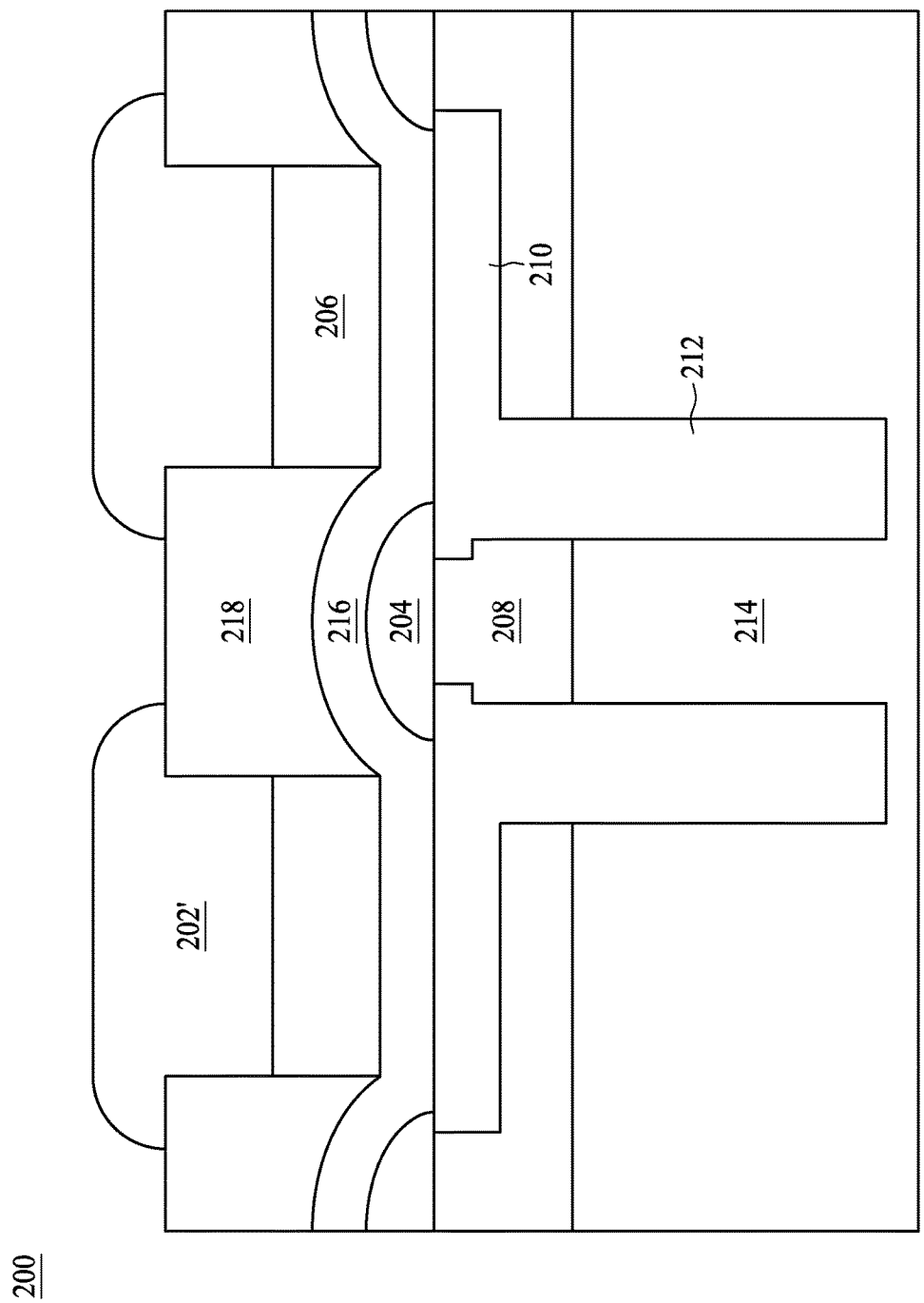

FIGS. 2G and 2H illustrate a method of manufacturing a semiconductor device in accordance with some embodiments of the present disclosure. The steps illustrated in FIGS. 2G and 2H may be performed instead of those illustrated in FIGS. 2E and 2F, respectively.

Referring to FIG. 2G, the UBMs 206 and solder paste 202' are disposed in the openings 217 subsequent to the formation of the patterned photoresist 218 as shown in FIG. 2D. The structure as shown in FIG. 2G is similar to the structure as shown in FIG. 2E except that the solder paste 202' is formed over the patterned photoresist 218. As such, relatively more solder paste 202' is used to fill the openings 217.

Referring to FIG. 2H, the patterned photoresist 218 and the seed layer 216 under the patterned photoresist 218 are removed by an etching technique (e.g., by spraying an etchant onto the structure as shown in FIG. 2H). During the spraying of the etchant, the structure as shown in FIG. 2G spins to facilitate the etching. The space or gap between the isolation structure 204 and an adjacent UBM 206 (or an adjacent portion of seed layer 216) creates capillarity or siphonage to help the etchant flow deep into the space or gap and to more efficiently remove the seed layer 216 under the patterned photoresist 218. Furthermore, the aspect ratio of the space between any two UBMs 206 is substantially reduced due to the presence of the isolation structures 204, and the reduced aspect ratio helps the etchant flow into the spaces so as to more efficiently remove the portions of the seed layer 216 under the patterned photoresist 218.

The solder paste 202' may have a mushroom-like contour. The solder paste 202' includes rims formed by overflowed solder material on the top surface of the patterned photoresist 218. The rims of the solder paste 202' may not be conducive to removing the seed layer 216, for example, the seed layer 216 under the rims of the solder paste 202'. The isolation structure 204 helps to allow flow of the etchant into the space under the rims due to the above-mentioned capillarity, siphonage, and reduced aspect ratio. Additionally, the shape of the isolation structure 204 is, for example, but not limited to, a semi-elliptical cross section, which helps flow of the etchant to the space under the rims and to remove the patterned photoresist 218 and portions of the seed layer 216.

The structure as shown in FIG. 2H may be reflowed to form the semiconductor device 100 as shown in FIG. 1B (e.g., an etchant may be sprayed on the solder paste 202' to form the solder bumps 102).

FIGS. 3A, 3B, 3C, 3D, 3E, and 3F illustrate a method of manufacturing a semiconductor device 300 in accordance with some embodiments of the present disclosure. The elements shown in FIGS. 3A-3F are similar to those with similar names shown in and described with respect to FIGS. 1A-1C.

Figure 3A:
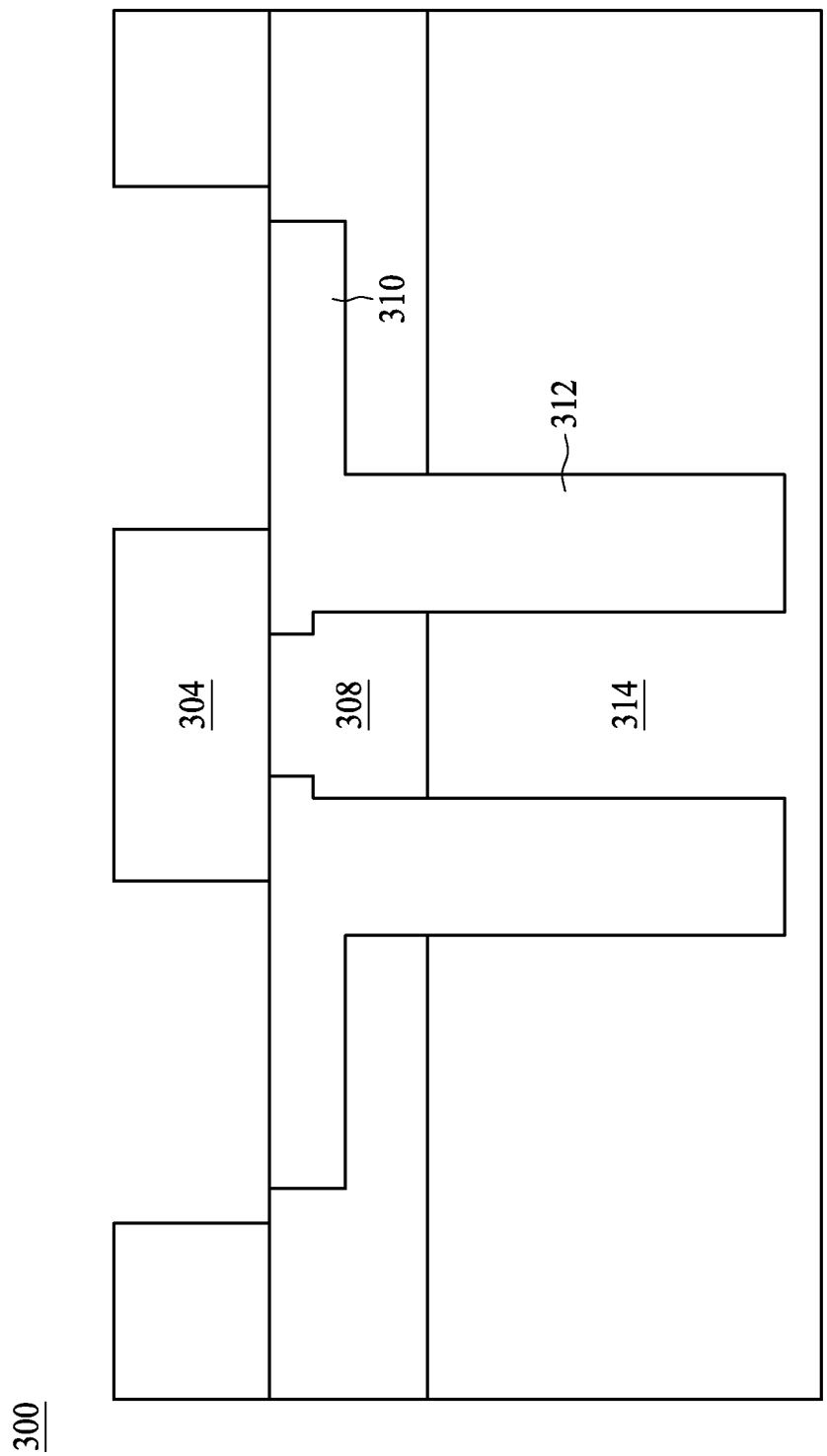

Referring to FIG. 3A, the conductive vias 312, which are made of a conductive material, are formed in the substrate 314. The passivation layer 308, which is formed on the substrate 314, may include an insulating material. The passivation layer 308 surrounds the patterned conductive layer 310. A portion of the patterned conductive layer 310 is exposed by the top surface of the passivation layer 308. The patterned conductive layer 310 may include an RDL which may include traces and/or interconnections (e.g., vias). The patterned conductive layer 310 may include a conductive material. The patterned conductive layer 310 is electrically connected to the conductive vias 312. The substrate 314 may be an organic substrate, a ceramic substrate, a glass substrate, or any other suitable substrate type. The patterned conductive layer 310 and conductive vias 312 may be formed by techniques such as photomasking, etching, depositing, electroplating, and the like. In FIG. 3A, the isolation structures 304 are formed on the passivation layer 308 to cover parts of the passivation layer 308 and parts of the exposed portions of conductive layer 310. The isolation structure 304 may include an insulating material. The isolation structures 304 may be formed by positive photoresists and photomasks. The structure shown in FIG. 3A is similar to the structure shown in FIG. 2B, but a difference between the structures shown in FIGS. 2B and 3A are the cross-sectional views of the isolation structures 204 and 304. For example, the cross-sectional view of the isolation structure 204 is semi-elliptical, and the cross-sectional view of the isolation structure 304 is rectangular.

Figure 3B:
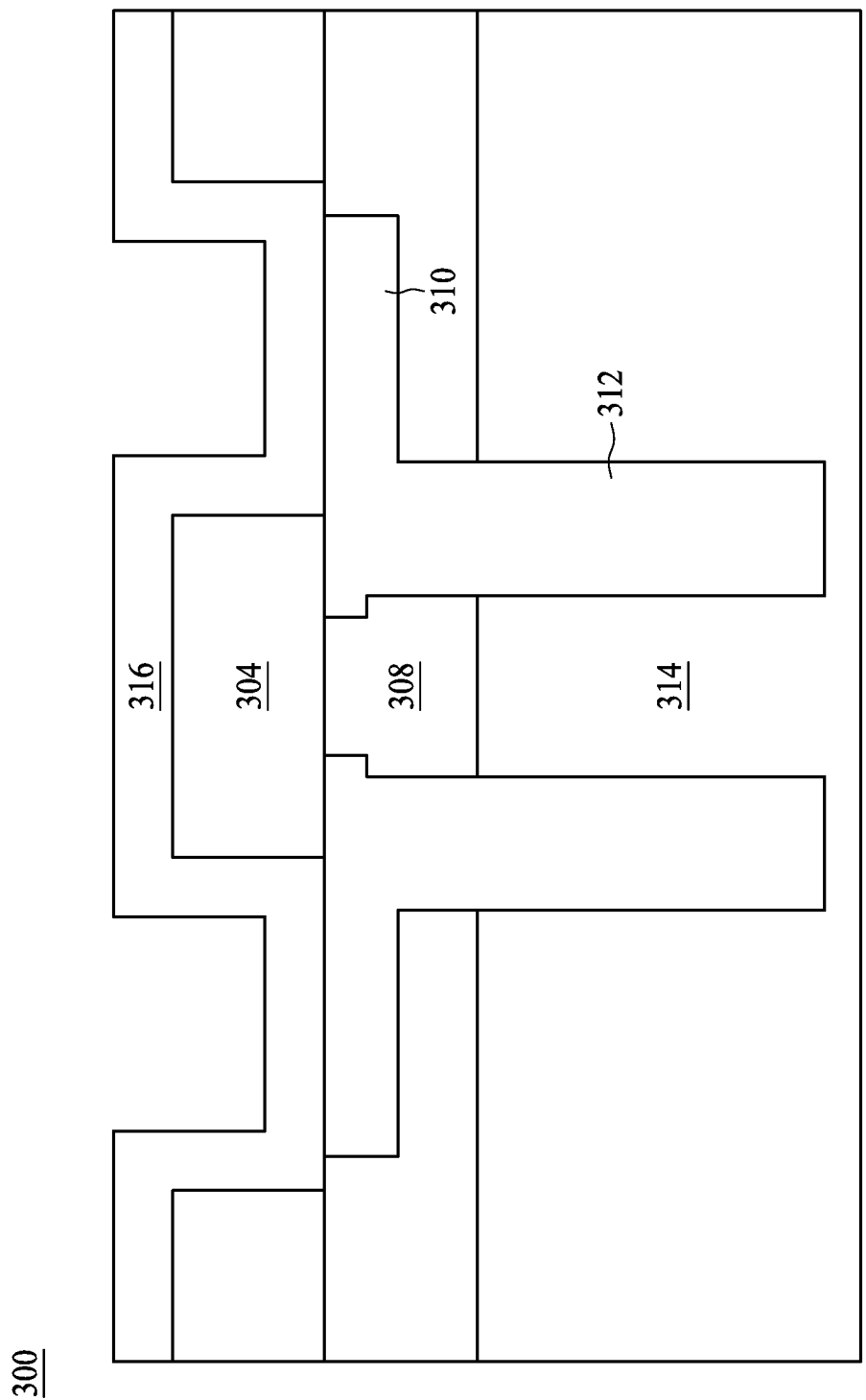

Referring to FIG. 3B, a seed layer 316 is form (e.g., by a sputtering technique) onto the isolation structures 304, passivation layer 308, and the patterned conductive layer 310 exposed by the isolation structures 304. The seed layer 316 may include, for example, but not be limited to, a Ti/Cu layer. In some embodiments, the seed layer 316 may include two sublayers, in which a lower sublayer includes Ti and an upper sublayer includes Cu.

Figure 3C:
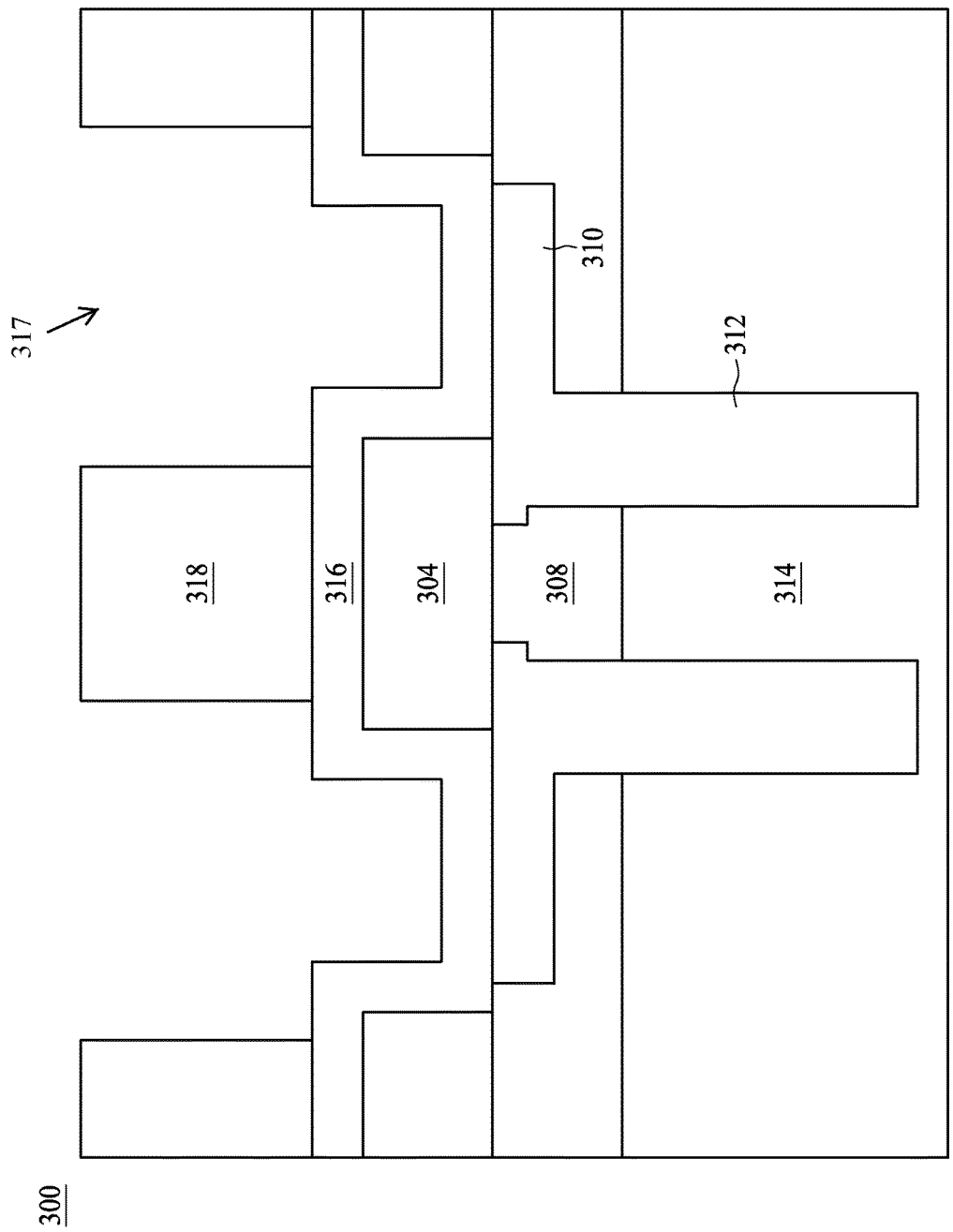

Referring to FIG. 3C, a patterned photoresist 318 is formed on portions of the seed layer 316 which are on the isolation structures 304. The patterned photoresist 318 defines a plurality of openings 317. The patterned photoresist 318 may be formed by photolithographic techniques. For example, the patterned photoresist 318 may be formed using the process of photomask application, exposure, and development. The width of a portion of the photoresist 318 is substantially smaller than that of the isolation structure 304 on which said portion of the photoresist 318 is formed.

Figure 3D:
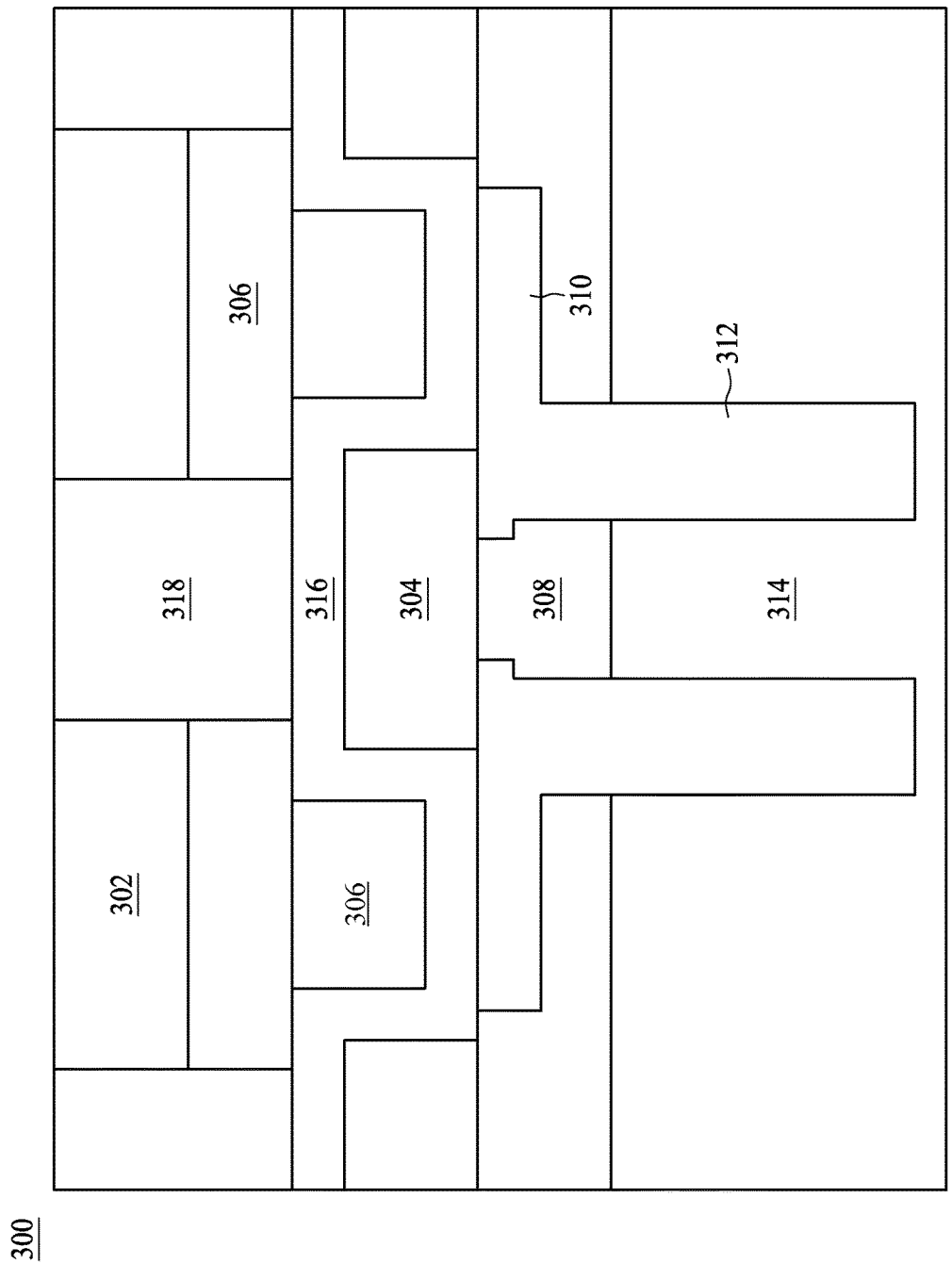

Referring to FIG. 3D, the UBMs 306 and solder paste 302 are formed on the seed layer 316. The UBM 306 and solder paste 302 are formed in the openings 317. The UBMs 306 and solder paste 302 may be formed by electroplating. The UBMs 306, solder paste 302, and patterned conductive layer 310 are electrically connected. The solder paste 302 may be formed with a conductive material. The solder paste 302 may be formed with a metal, an alloy or the like. The solder paste 302 may include Sn. The UBMs 306 may include a conductive pillar which includes, for example, but is not limited to, a stack of conductive layers. In some embodiments of the present disclosure, the UBMs 306 may include a conductive pillar which includes a single conductive layer. The UBMs 306 may include a metal composition including Ni and/or Cu. As shown in FIG. 3D, the UBMs 306 may be formed as including two segments, each of which having a different width.

Referring to FIG. 3E, the patterned photoresist 318 and the seed layer 216 under the patterned photoresist 318 are removed by an etching technique (e.g., by spraying an etchant onto the structure as shown in FIG. 3D). During the spraying of the etchant, the structure shown in FIG. 3D spins to facilitate the etching. The aspect ratio of the space between any two UBMs 306 is substantially reduced due to the presence of the isolation structures 304, and the reduced aspect ratio helps the etchant to flow into the space so as to more efficiently remove the portions of the seed layer 316 under the patterned photoresist 318.

Figure 3F:
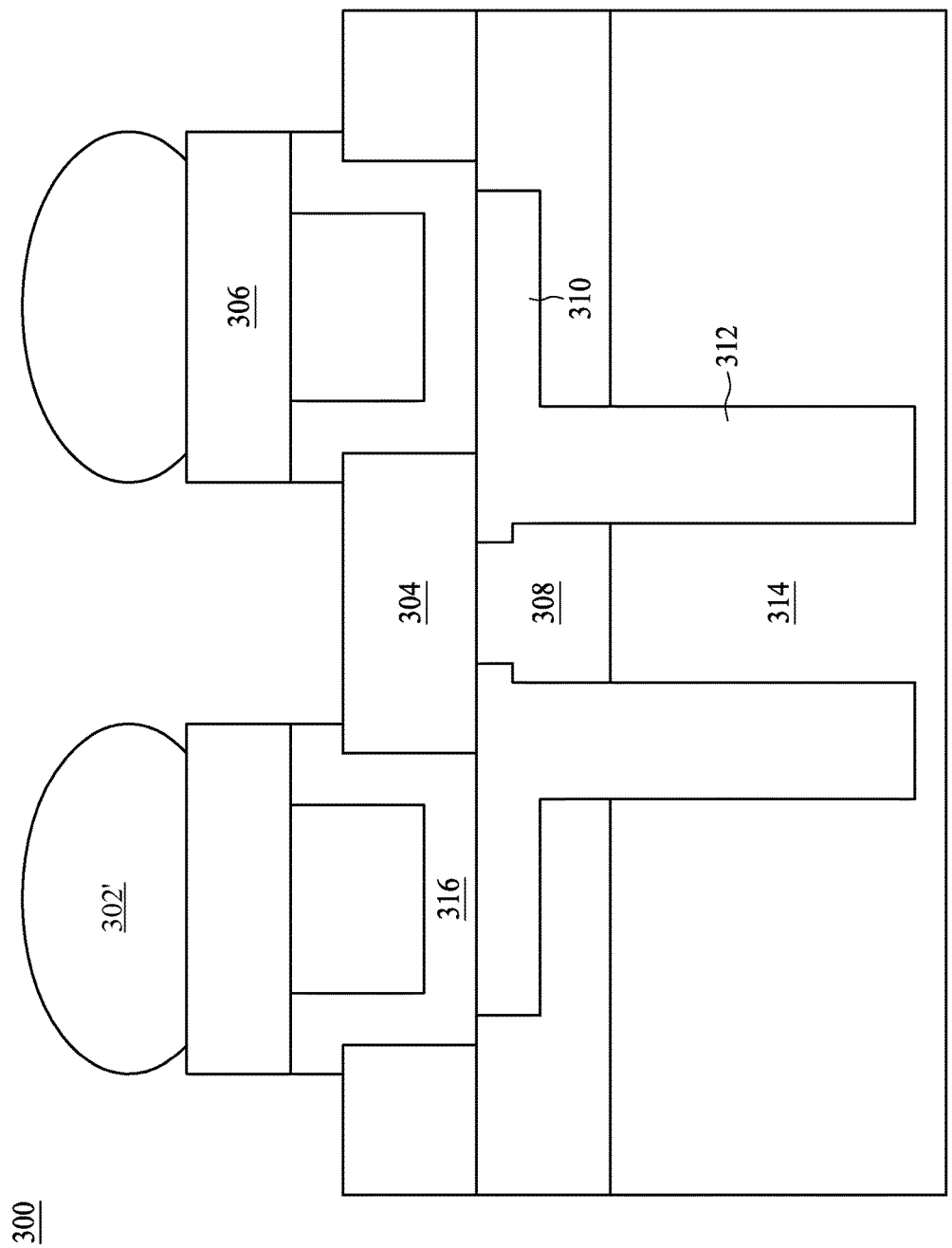

The structure as shown in FIG. 3E may be reflowed by an etchant to form the semiconductor device 300 as shown in FIG. 3F. The solder paste 302 as shown in FIG. 3E is reflowed to form the solder bumps 302'. Referring to FIG. 3F, the semiconductor device 300 includes the solder bumps 302', the isolation structures 304, the UBMs 306, the passivation layer 308, the patterned conductive layer 310, the conductive vias 312, the substrate 314, and the seed layer 316.

FIGS. 4A and 4B illustrate a method of manufacturing an isolation structure with a grayscale photomask in accordance with some embodiments of the present disclosure. Referring to FIG. 4A, a grayscale photomask 404 is used to partially expose a photoresist 402 (e.g., a positive or negative photoresist) to ultraviolet (UV) light (as shown by the arrows) so as to partially remove the photoresist 402 on the substrate 400. The use of the grayscale photomask 404 also allows portions of the photoresist 402 to be partially (e.g., 0%, 10%, 20%, 50%, or other suitable percentages of the photoresist 402) removed. According to some embodiments of the present disclosure, any suitable grayscale photomask 404 may be used to form three-dimensional structures on the photoresist 402.

Referring to FIG. 4B, subsequent to the removal of the photoresist 402, an isolation structure 402' is formed. The isolation structure 402' has a step structure. In some embodiments, the contour of the isolation structure 402' may be smoothed (e.g., to form a semi-elliptical contour) as the resolution of the grayscale photomask 404 increases relatively.

Figure 5B:
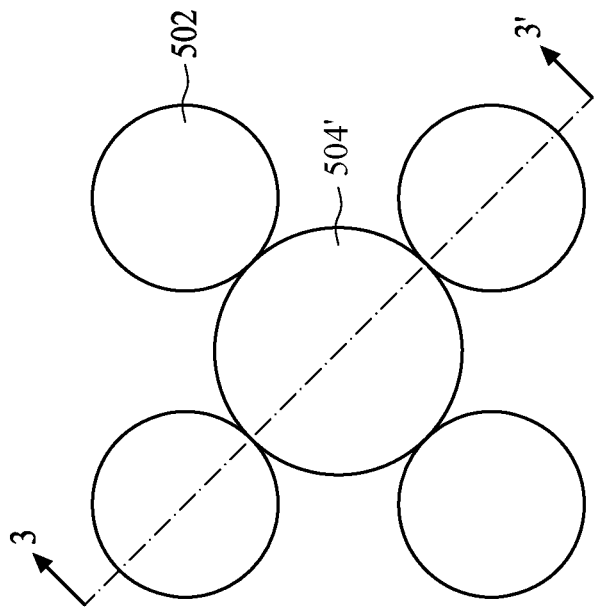
FIG. 5B is a top view of an isolation structure in accordance with some embodiments of the present disclosure.
Figure 5A:
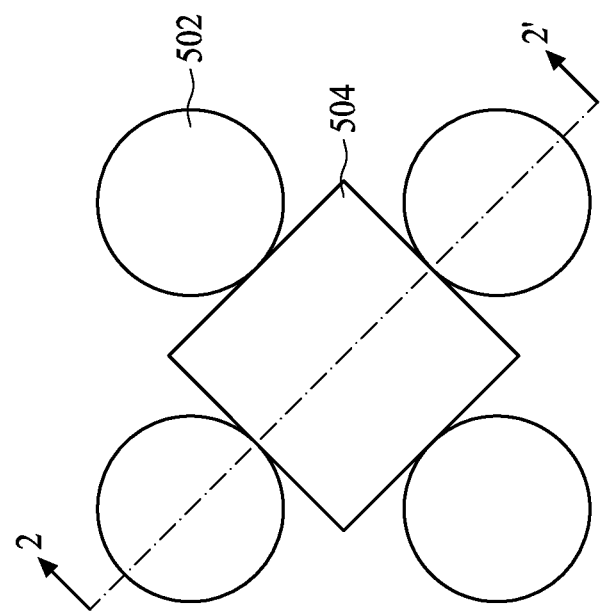
FIG. 5A is a top view of an isolation structure in accordance with some embodiments of the present disclosure.

FIG. 5A shows a top view of an example of an isolation structure 504 which may have, but is not limited to, a rectangular structure in accordance with some embodiments.

FIG. 5B shows a top view of an example of an isolation structure 504' which may have, but is not limited to, a circular structure. Solder bumps 502 and the isolation structure 504 and 504' are shown in FIGS. 5A and 5B. The elements shown in FIGS. 5A and 5B are similar to those with similar names shown in and described with respect to FIGS. 1A-1C.

Figure 5C:
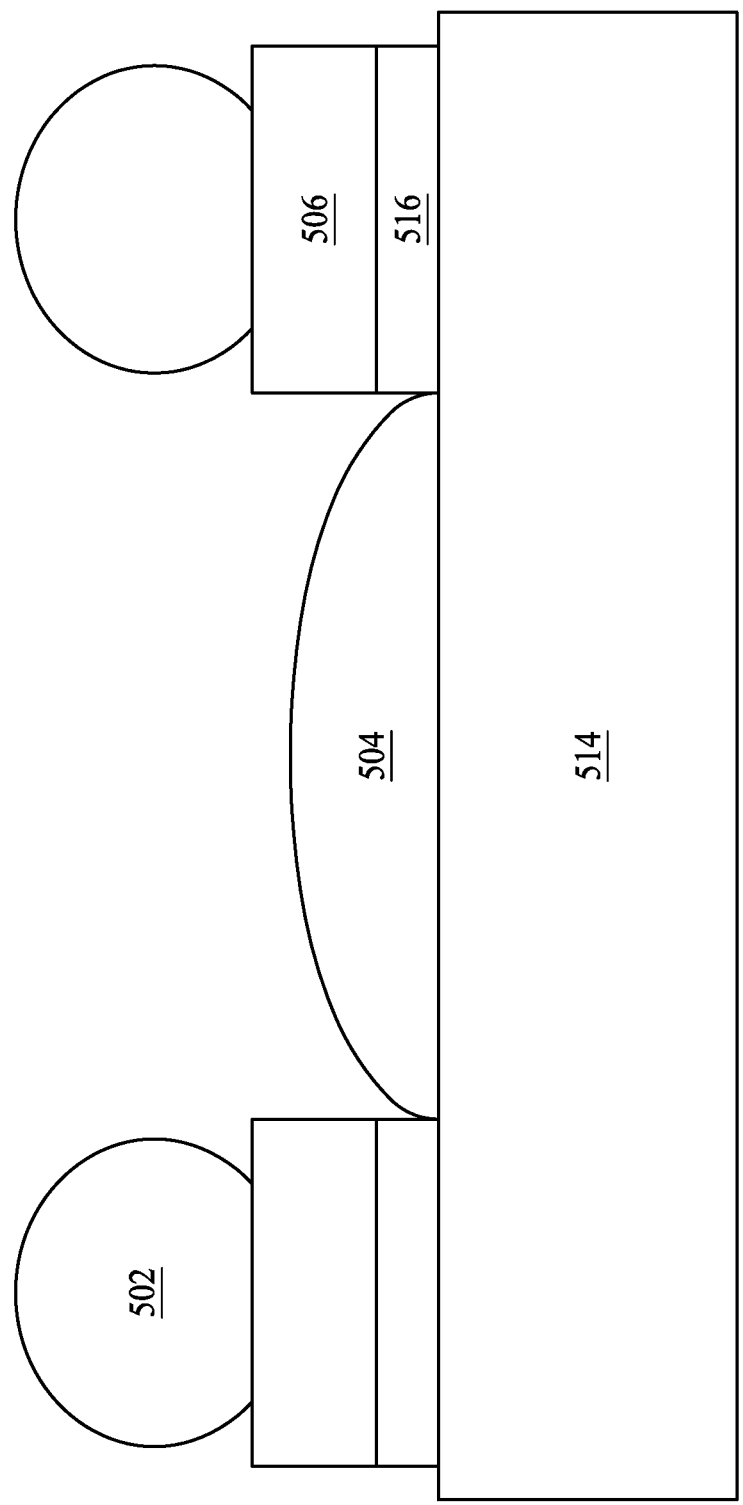
FIG. 5C is a cross-sectional view of an isolation structure in accordance with some embodiments of the present disclosure.

FIG. 5C shows a cross-sectional view across the line 2-2' shown in FIG. 5A or the line 3-3' shown in FIG. 5B. In some embodiments, the isolation structure 504 or 504' has a semi-elliptical cross-sectional structure.

Figure 5D:
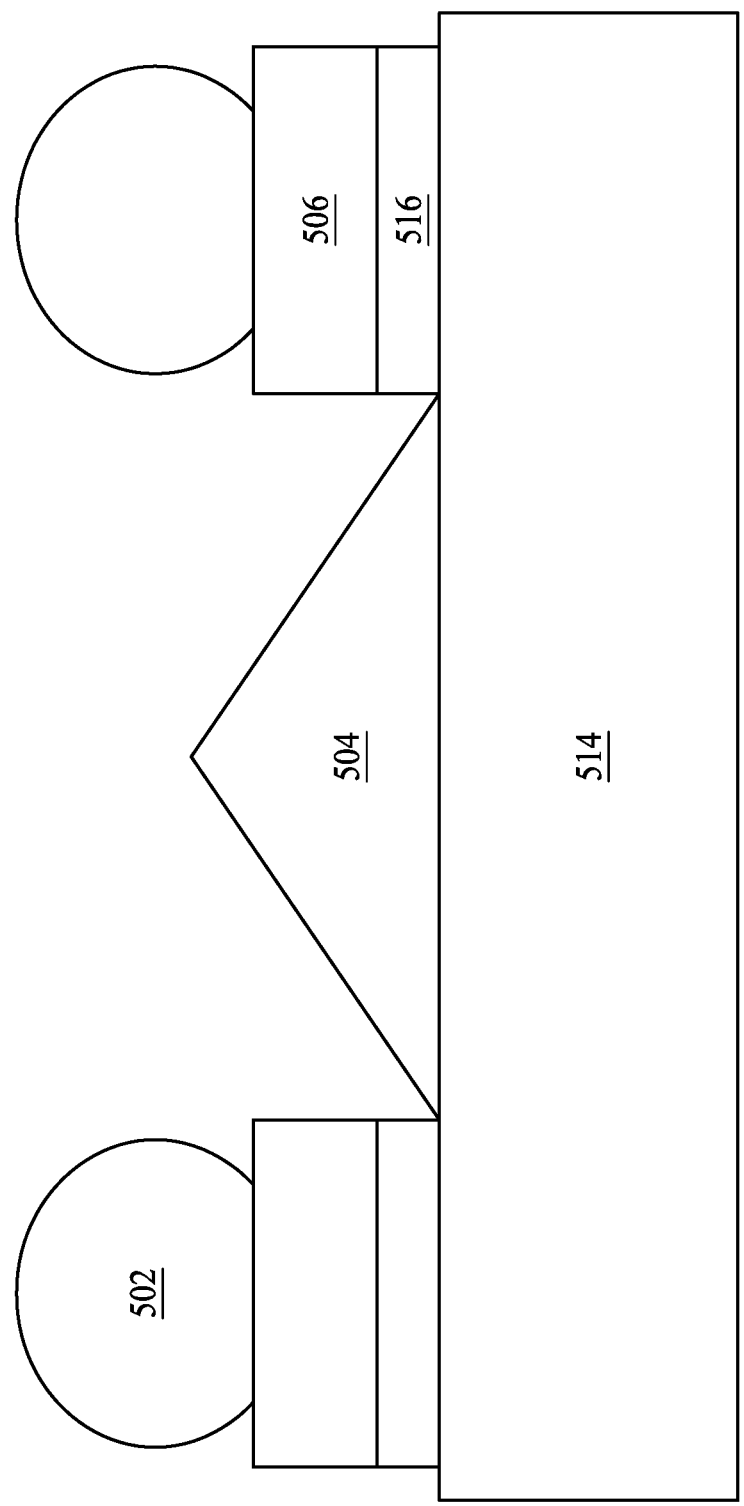
FIG. 5D is a cross-sectional view of an isolation structure in accordance with some embodiments of the present disclosure.

FIG. 5D shows a cross-sectional view across the line 2-2' shown in FIG. 5A or the line 3-3' shown in FIG. 5B In some embodiments, the isolation structure 504 or 504' has a triangular cross-sectional structure. For simplicity, a patterned conductive layer, conductive vias, and a passivation layer are not depicted in FIGS. 5C and 5D. Solder bumps 502, isolation structures 504, UBMs 506, a substrate 514, and seed layers 516 are shown in FIGS. 5C and 5D. The elements shown in FIGS. 5C and 5D are similar to those with similar names shown in and described with respect to FIGS. 1A-1C.

In some embodiments, the cross-sectional view of an example of the isolation structure 504 may be, but is not limited to, a semi-circle. For example, the cross-sectional view of an example of the isolation structure 504 across the line 2-2' shown in FIG. 5A may be, but is not limited to, a semi-ellipse, a semi-circle, or a triangle. Additionally, the cross-sectional view of an example of the isolation structure 504' along the line 3-3' shown in FIG. 5B may be, but is not limited to, a semi-ellipse, a semi-circle, or a triangle.

In some embodiments, the three-dimensional structure of an example of the isolation structures 504 or 504' may be, but is not limited to, a substantially triangular pyramid structure, a substantially quadrangle pyramid structure, a substantially polygonal pyramid structure, a substantially conical structure, a substantially spherical structure, a substantially hemispherical structure, a substantial aspherical structure, a substantial semi-aspherical structure, or a substantially pillar structure.

As used herein, the singular terms "a," "an," and "the" may include plural referents unless the context clearly dictates otherwise.

As used herein, the terms "conductive" and "electrically connected" refer to an ability to transport an electric current. Conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
   a substrate;
   a patterned conductive layer on the substrate;
   a passivation layer on the substrate and surrounding the patterned conductive layer;
   a first under bump metallurgy (UBM) and a second UBM on the passivation layer and electrically connected to the patterned conductive layer; and
   an isolation structure on the passivation layer and between the first UBM and the second UBM, wherein the isolation structure is a protrusion from the passivation layer.

2. The semiconductor device of claim 1, wherein a first distance between the first UBM and the isolation structure is smaller than a second distance between the first UBM and the second UBM.

3. The semiconductor device of claim 1, wherein the protrusion from the passivation layer comprises a substantially triangular pyramid structure, a substantially quadrangle pyramid structure, a substantially polygonal pyramid structure, a substantially conical structure, a substantially spherical structure, a substantially hemispherical structure, a substantially aspherical structure, a substantially semi-aspherical structure, or a substantially pillar structure.

4. The semiconductor device of claim 1, wherein the first UBM contacts the isolation structure.

5. The semiconductor device of claim 1, wherein the first UBM is separated from the isolation structure.

6. The semiconductor device of claim 1, further comprising a solder bump on the first UBM and a seed layer under the first UBM.

7. The semiconductor device of claim 6, wherein the isolation structure has a first height and wherein the first UBM, the solder bump and the seed layer has a second height, and a ratio of the first height to the second height ranges from approximately 0.05 to approximately 0.4.

8. The semiconductor device of claim 6, wherein the isolation structure has a first height and wherein the first UBM, the solder bump, and the seed layer has a second height, and a ratio of the first height to the second height ranges from approximately 0.1 to approximately 0.2.

9. The semiconductor device of claim 6, wherein the seed layer is disposed between the first UBM and the passivation layer.

10. The semiconductor device of claim 6, wherein the seed layer contacts the isolation structure.

11. The semiconductor device of claim 6, wherein the isolation structure includes an insulating material.

12. The semiconductor device of claim 6, wherein the seed layer is in contact with the isolation structure.

13. The semiconductor device of claim 1, further comprising a third UBM and a fourth UBM, wherein the isolation structure is disposed between the first UBM, the second UBM, the third UBM and the fourth UBM.

14. The semiconductor device of claim 1, further comprising a chip electrically connected to the first UBM and the second UBM.

15. A semiconductor device, comprising:
    a substrate;
    a patterned conductive layer on the substrate;
    a passivation layer on the substrate and surrounding the patterned conductive layer, the passivation layer exposing a first portion and a second portion of the patterned conductive layer, the first portion of the patterned conductive layer being separated from the second portion of the patterned conductive layer;
    a first seed layer and a second seed layer on the passivation layer, the first seed layer contacting the first portion of the patterned conductive layer and the second seed layer contacting the second portion of the patterned conductive layer; and
    an isolation structure between the first seed layer and the second seed layer, wherein the isolation structure is a protrusion from the passivation layer.

16. The semiconductor device of claim 15, further comprising a first under bump metallurgy (UBM) on the first seed layer and a second UBM on the second seed layer.

17. The semiconductor device of claim 16, further comprising a solder bump on the first UBM, wherein the isolation structure has a first height and wherein the first UBM, the solder bump, and the first seed layer has a second height, and a ratio of the first height to the second height ranges from approximately 0.05 to approximately 0.4.

18. The semiconductor device of claim 16, further comprising a solder bump on the first UBM, wherein the isolation structure has a first height and wherein the first UBM, the solder bump, and the first seed layer has a second height, and a ratio of the first height to the second height ranges from approximately 0.1 to approximately 0.2.

19. The semiconductor device of claim 16, further comprising a third UBM and a fourth UBM, wherein the isolation structure is disposed between the first UBM, the second UBM, the third UBM and the fourth UBM.

20. The semiconductor device of claim 16, further comprising a chip electrically connected to the first UBM and the second UBM.

21. The semiconductor device of claim 15, wherein the isolation structure is separated from the first seed layer and the second seed layer.

22. The semiconductor device of claim 15, wherein the isolation structure is in contact with the first seed layer and the second seed layer.

23. A method for manufacturing a semiconductor device, comprising:
providing a substrate;
forming a patterned conductive layer on the substrate;
forming a patterned passivation layer on the substrate to surround the patterned conductive layer and to expose portions of the patterned conductive layer; and
forming an isolation structure that is protruded from the patterned passivation layer and parts of exposed portions of the patterned conductive layer.

24. The method of claim 23, further comprising forming a seed layer on the isolation structure and the exposed portions of the patterned conductive layer.

25. The method of claim 24, further comprising forming a plurality of under bump metallurgies (UBMs) on the seed layer on the exposed portions of the patterned conductive layer.

26. The method of claim 25, further comprising removing the seed layer on the isolation structure.

27. The method of claim 26, wherein the isolation structure is separated from portions of the seed layer under the UBMs.

28. The method of claim 26, wherein the isolation structure is in contact with portions of the seed layer under the UBMs.

* * * * *